(12) United States Patent
Jagannathan et al.

(10) Patent No.: US 8,304,836 B2
(45) Date of Patent: Nov. 6, 2012

(54) STRUCTURE AND METHOD TO OBTAIN EOT SCALED DIELECTRIC STACKS

(75) Inventors: Hemanth Jagannathan, Albany, NY (US); Takashi Ando, Yorktown Heights, NY (US); Lisa F. Edge, Albany, NY (US); Sufi Zafar, Yorktown Heights, NY (US); Changhwan Choi, Yorktown Heights, NY (US); Paul C. Jamison, Hopewell Junction, NY (US); Vamsi K. Paruchuri, Albany, NY (US); Vijay Narayanan, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 277 days.

(21) Appl. No.: 12/620,234

(22) Filed: Nov. 17, 2009

(65) Prior Publication Data

US 2011/0115027 A1    May 19, 2011

(51) Int. Cl.
*H01L 21/70* (2006.01)
(52) U.S. Cl. ........ 257/369; 257/288; 257/314; 257/315; 257/316; 257/E29.255
(58) Field of Classification Search .......... 257/288, 257/314, 315, 316, 369, E29.255
See application file for complete search history.

(56) References Cited

U.S. PATENT DOCUMENTS

| 7,429,515 B2 | 9/2008 | Ahn et al. |
| 7,547,951 B2 * | 6/2009 | Lim et al. ............. 257/410 |
| 2007/0170541 A1 | 7/2007 | Chui et al. |
| 2008/0057659 A1 | 3/2008 | Forbes et al. |
| 2008/0121962 A1 | 5/2008 | Forbes et al. |
| 2009/0085175 A1 * | 4/2009 | Clark et al. ............. 257/637 |
| 2010/0258878 A1 * | 10/2010 | Mise et al. ............. 257/369 |

OTHER PUBLICATIONS

Choi K., et al., "Extremely scaled gate-first high-k/metal gate stack with EOT of 0.55 nm using novel interfacial layer scavenging techniques for 22nm technology node and beyond" VLSI Technology, 2009 Symposium, Jun. 16-18, 2009, pp. 138-139.

* cited by examiner

*Primary Examiner* — Tan N Tran
(74) *Attorney, Agent, or Firm* — Scully, Scott, Murphy & Presser, P.C.; Louis J. Percello, Esq.

(57) ABSTRACT

Equivalent oxide thickness (EOT) scaled high k/metal gate stacks are provided in which the capacitance bottleneck of the interfacial layer is substantially eliminated, with minimal compromise on the mobility of carriers in the channel of the device. In one embodiment, the aforementioned EOT scaled high k/metal gate stacks are achieved by increasing the dielectric constant of the interfacial layer to a value that is greater than the originally formed interfacial layer, i.e., the interfacial layer prior to diffusion of a high k material dopant element therein. In another embodiment, the aforementioned scaled high k/metal gate stacks are achieved by eliminating the interfacial layer from the structure. In yet another embodiment, the aforementioned high k/metal gate stacks are achieved by both increasing the dielectric constant of the interfacial layer and reducing/eliminating the interfacial layer.

18 Claims, 6 Drawing Sheets

STRUCTURE AND METHOD TO OBTAIN EOT SCALED DIELECTRIC STACKS

BACKGROUND

The present invention generally relates to semiconductor structures and methods of fabricating the same. More particularly, the present invention relates to semiconductor structures having equivalent oxide thickness (EOT) scaled dielectric stacks including high k dielectrics. The present invention also relates to interfacial scavenger techniques that can be employed in fabricating the semiconductor structures having the scaled EOT dielectric stacks.

The reduction of dielectric thickness in a metal oxide semiconductor field effect transistor (MOSFET) is crucial to scaling the gate length and for the progress of semiconductor technology for future generations. With the reduction of the thickness of the conventional oxide/oxynitride dielectric layer in MOSFETs, there is an exponential increase in gate leakage which, in turn, results in an increased power consumption of the device. Moreover, the thickness of the dielectric is now close to a few atomic layers raising reliability concerns. Furthermore, the use of a polysilicon gate electrode has issues with dopant activation and poly depletion that increases the inversion layer thickness.

Gate stacks comprised of a high k gate dielectric, i.e., dielectrics having a dielectric constant that is greater than silicon oxide, and an overlying metal gate are being used to replace conventional gate stacks comprised of silicon oxide and polysilicon to enable transistor scaling. In high k/metal gate stacks there is usually the presence of an interfacial layer (typically silicon dioxide) that exists between the high k dielectric and the underlying semiconductor substrate. In such structures the capacitance of the gate is determined by the following equation:

Capacitance of the gate=(capacitance of the high $k$ gate dielectric×capacitance of the interfacial layer)/(capacitance of the high $k$ gate dielectric+ capacitance of the interfacial layer)

The interface capacitance limits the overall scalability of the gate stacks and acts as a bottleneck in gate stack scaling. While removal of the interfacial layer is possible, the same results in severe carrier mobility penalty.

SUMMARY

EOT scaled high k/metal gate stacks are provided in which the capacitance bottleneck of the interfacial layer is substantially eliminated, with minimal compromise on the mobility of carriers in the channel of the device.

In one embodiment, the aforementioned EOT scaled high k/metal gate stacks are achieved by increasing the dielectric constant of an originally formed interfacial layer to a value that is greater than the originally formed interfacial layer. In another embodiment, the aforementioned EOT scaled high k/metal gate stacks are achieved by eliminating the original interfacial layer from the structure. In yet another embodiment, the aforementioned high k/metal gate stacks are achieved by both increasing the dielectric constant of the original interfacial layer and reducing/eliminating the original interfacial layer.

In general terms, EOT scaled high k/metal gate stacks are provided in which the capacitance bottleneck of the interfacial layer is substantially eliminated, with minimal compromise on the mobility of carriers in the channel of the device by incorporating at least one high k material dopant element into an originally formed interfacial layer. The at least one high k material dopant element employed is an element overlying interfacial scaling material layer which diffuses into the originally formed interfacial layer during a subsequent processing step. The incorporated at least one high k material dopant element reacts with the originally formed interfacial layer forming a modified interfacial layer that has an effective dielectric constant that is greater than that of the originally formed interfacial layer. In some embodiments of the invention, the high k material dopant element completely 'scavenges' all of the oxygen from the originally formed interfacial layer which, in essence, eliminates the originally formed interfacial layer from the structure.

In one aspect of the invention, a semiconductor structure is provided that includes a semiconductor substrate having at least one device region located therein. At least one patterned gate stack is located on an upper surface of the semiconductor substrate in the at least one device region. The at least one patterned gate stack includes, from bottom to top, a modified interfacial layer, a high k gate dielectric, a metallic electrode and a Si-containing electrode. The modified interfacial layer includes at least one high k dopant material element incorporated therein. Moreover, the modified interfacial layer has a dielectric constant that is greater than an originally formed interfacial layer not including the at least one high k material dopant element.

An optional interfacial scaling material layer can be present on one of an upper surface of the modified interfacial layer, an upper surface of the high k gate dielectric, or an upper surface of the metallic electrode. The optional interfacial scaling material layer includes an nFET threshold voltage adjusting element or a pFET threshold voltage adjusting element. The nFET threshold voltage adjusting element and the pFET threshold voltage adjusting element represent the high k material dopant element mentioned above.

In some embodiments, the metallic electrode includes an nFET threshold voltage adjusting element or a pFET threshold voltage adjusting element embedded therein.

In another embodiment, a semiconductor structure is provided that includes a semiconductor substrate having at least an nFET device region and a pFET device region that are separated by an isolation region located within the semiconductor substrate. At least one patterned nFET gate stack is located on an upper surface of the semiconductor substrate in the nFET device region. The at least one patterned nFET gate stack includes, from bottom to top, an nFET modified interfacial layer, a high k gate dielectric, a metallic electrode and a Si-containing electrode. The nFET modified interfacial layer includes at least one nFET threshold voltage adjusting element incorporated therein. Moreover, the nFET modified interfacial layer has a dielectric constant that is greater than an originally formed interfacial layer not including the at least one nFET threshold voltage adjusting element. The structure also includes at least one patterned pFET gate stack located on an upper surface of the semiconductor substrate in the pFET device region. The at least one patterned pFET gate stack includes, from bottom to top, a pFET modified interfacial layer, a high k gate dielectric, a metallic electrode and a Si-containing electrode. The pFET modified interfacial layer includes at least one pFET threshold voltage adjusting element incorporated therein. Moreover, the pFET modified interfacial layer has a dielectric constant that is greater than an originally formed interfacial layer not including the at least one pFET threshold voltage adjusting element.

In another aspect of the invention, a method is provided that includes incorporating at least one high k material dopant element within an interfacial layer of at least one patterned gate stack including a high k gate dielectric, a metallic electrode and a Si-containing electrode, wherein the incorporating element modifies the interfacial layer into a modified interfacial layer including the at least one high k material dopant element incorporated therein. Moreover, the modified interfacial layer has a dielectric constant that is greater than the originally formed interfacial layer not including the at least one high k material dopant element.

The incorporating of the at least one high k material dopant element includes diffusion of a high k material dopant element (either an nFET threshold voltage adjusting element or a pFET threshold voltage adjusting element) from either an overlying interfacial scaling material layer or a metallic electrode that includes the same. In one embodiment, the overlying interfacial scaling material layer is located directly on an upper surface of the interfacial layer. In another embodiment, the overlying interfacial scaling material layer is located directly on an upper surface of the high k gate dielectric. In a further embodiment, the overlying interfacial scaling material is located directly on an upper surface of said metallic electrode.

In yet another aspect of the invention, a method is provided that includes providing a semiconductor substrate having an nFET device region and a pFET device region; and providing an EOT scaled nFET within the nFET device region and an EOT scaled pFET in the pFET device region. The EOT scaled nFET includes, from bottom to top, an nFET modified interfacial layer including an nFET threshold voltage adjusting element incorporated therein, a high k gate dielectric, a metallic electrode and a Si-containing electrode, and the EOT scaled pFET includes, from bottom to top, a pFET modified interfacial layer including a pFET threshold voltage adjusting element incorporated therein, a high k gate dielectric, a metallic electrode and a Si-containing electrode.

DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Various embodiments of the present invention will now be described in greater detail by referring to the following discussion and drawings that accompany the present application. The drawings of the present application, which are referred to herein below in greater detail, are provided for illustrative purposes and, as such, they are not drawn to scale.

Figure 1:
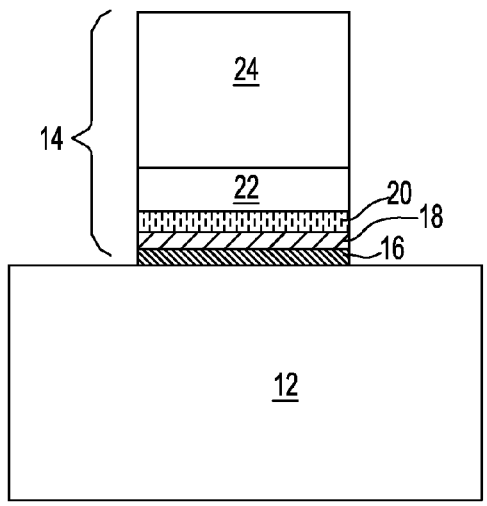
FIG. 1 is a pictorial representation (through a cross sectional view) depicting a semiconductor structure in accordance with one embodiment in which an interfacial scaling material layer is present on an upper surface of a high k gate dielectric.

Reference is first made to the semiconductor structure 10 that is illustrated in FIG. 1. Specifically, FIG. 1 illustrates a semiconductor structure 10 that includes an EOT scaled high k/metal gate stack 14 located on a surface of a semiconductor substrate 12. The particular embodiment illustrated in FIG. 1 represents an embodiment in which a unipolar semiconductor structure, e.g., pFET or nFET, is formed. The scaled high k/metal gate stack 14 includes, from bottom to top, a modified interfacial layer 16, a high k gate dielectric 18, an optional interfacial scaling material layer 20, a metallic electrode 22 and a Si-containing electrode 24.

The semiconductor structure 10 illustrated in FIG. 1 is formed utilizing the following processing scheme. First, semiconductor substrate 12 is provided. The semiconductor substrate 12 employed comprises any semiconductor material including, but not limited to Si, Ge, SiGe, SiGeC, Ga, GaAs, InAs, InP and all other III/V or II/VI compound semiconductors. Semiconductor substrate 12 may also comprise an organic semiconductor or a layered semiconductor such as, for example, Si/SiGe, a semiconductor-on-insulator (SOI) or a SiGe-on-insulator (SiGOI). Semiconductor substrate 12 can also include a hybrid semiconductor substrate including at least two surface regions that have different crystallographic orientations. The hybrid substrate can have regions that are all SOI like (i.e., have a buried insulating layer beneath an SOI layer) or some regions can be SOI like and others are bulk like. In some embodiments, it is preferred that the semiconductor substrate 12 be composed of a Si-containing semiconductor material, i.e., a semiconductor material that includes silicon.

The semiconductor substrate 12 can be doped, undoped or contain doped and undoped regions therein. For example, the semiconductor substrate 12 can include a first doped (n- or p) region, and a second doped (n- or p-) region. For clarity, the doped regions are not specifically shown in the drawings. When present, the first and second doped regions can have the same conductivities and/or doping concentrations, or they can have different conductivities and/or doping concentrations. These doped regions are known as 'wells'.

At least one isolation region (not shown in the embodiment of FIG. 1) can be formed into the semiconductor substrate 12. The at least one isolation region can be a trench isolation region or a field oxide isolation region. The trench isolation region is formed utilizing a conventional trench isolation process well known to those skilled in the art. For example, lithography, etching and filling of a trench with a trench dielectric material can be used in forming the trench isolation region. Optionally a liner can be formed in the trench prior to trench fill, a densification step can optionally be performed after the trench fill and a planarization process can follow the trench fill as well. The field oxide isolation region can be formed utilizing a so-called local oxidation of silicon process. The at least one isolation region provides electrical isolation between neighboring gates regions, typically, but not necessarily, required when the neighboring gates have opposite conductivities. The neighboring gate regions can have the same conductivity (i.e., both n- or p-type), or alternatively, they can have different conductivities (i.e., one n-type and the other p-type).

An interfacial layer (which will subsequently become modified interfacial layer 16) is formed after processing the semiconductor substrate 12. The interfacial layer can be formed utilizing a conventional thermal growing technique that is well known to those skilled in the art including, for example, oxidation or oxynitirdation. When the exposed semiconductor substrate is a Si-containing material, the interfacial layer is comprised of silicon oxide, silicon oxynitride, or a nitrided silicon oxide. When the exposed semiconductor substrate is other than a Si-containing semiconductor material, the interfacial layer may comprise a semiconductor oxide, a semiconducting oxynitride or a nitrided semiconducting oxide.

The thickness of the interfacial layer is typically from 0.1 nm to 1.5 nm, with a thickness from 0.5 to 1.2 nm being even more typical. The thickness, however, may be different after processing at higher temperatures, which are usually required during device fabrication.

In one embodiment of the invention, the interfacial layer is a silicon oxide layer having a thickness from 0.5 nm to 0.8 nm that is formed by a wet chemical oxidation. The process step for this wet chemical oxidation includes treating a cleaned surface of a semiconductor material (such as a HF-last semiconductor surface) with a mixture of ammonium hydroxide, hydrogen peroxide and water (in a 1:1:5 ratio) at 65° C. Alternatively, the interfacial layer can also be formed by treating the HF-last semiconductor surface in ozonated aqueous solutions, with the ozone concentration usually varying from, but not limited to 2 parts per million (ppm) to 40 ppm.

A high k gate dielectric 18 having a dielectric constant of greater than 4.0, typically greater than 10, as measured in vacuum, is formed atop the interfacial layer. Examples of such dielectric materials having a dielectric constant of greater than 4.0 include, but are not limited to silicon nitride, silicon oxynitride, metal oxides, metal nitrides, metal oxynitrides and/or metal silicates. In one embodiment, the high k gate dielectric 18 is comprised of $HfO_2$, $ZrO_2$, $Al_2O_3$, $TiO_2$, $La_2O_3SrTiO_3$, $LaAlO_3$ $Y_2O_3$ and multilayered stacks thereof. In another embodiment of the invention, the high k gate dielectric 18 is an Hf-based gate dielectric including $HfO_2$, hafnium silicate and hafnium silicon oxynitride.

The high k gate dielectric 18 can be formed utilizing a thermal growth process such as, for example, oxidation, nitridation or oxynitridation. Alternatively, the high k gate dielectric 18 can be formed by a deposition process including, but not limited to chemical vapor deposition (CVD), plasma enhanced chemical vapor deposition (PECVD), metalorgano chemical vapor deposition (MOCVD), atomic layer deposition (ALD), evaporation, reactive sputtering and chemical solution deposition. The high k gate dielectric 18 may also be formed utilizing any combination of the aforementioned processes.

The thickness of the as deposited high k gate dielectric 18 may vary depending on the dielectric material employed as well as the process used to form the same. Typically, the thickness of the as deposited high k gate dielectric 18 is from 0.5 nm to 20 nm, with a thickness from 1 nm to 10 nm being even more typical.

In the illustrated embodiment, an interfacial scaling material layer 20 is formed atop the high k gate dielectric 18. The interfacial scaling material layer 20 can include an nFET threshold voltage adjusting material or a pFET threshold voltage adjusting material; these materials include a high k material dopant element that is subsequently introduced into the originally formed interfacial layer providing modified interfacial layer 16. The type of threshold voltage adjusting material employed is dependent on which conductivity type device, e.g., nFET or pFET, is being fabricated.

The nFET threshold voltage material that can be employed includes a rare earth metal, a rare earth metal-containing oxide, a rare earth metal-containing nitride, or any combination thereof.

A rare earth metal is a metal from Group IIIB of the Periodic Table of Elements (CAS version) including, for example, La, Ce, Pr, Nd, Pm, Sm, Eu, Ga, Tb, Dy, Ho, Er, Tm, Yb, Lu or mixtures thereof. Preferably, the rare earth metal or rare earth metal-containing composition (i.e., oxide or nitride) comprises at least one of La, Ce, Y, Sm, Er and Tb, with La being preferred.

The rare earth metal or rare earth metal-containing composition (i.e., oxide or nitride) is formed utilizing a conventional deposition process including, for example, evaporation, molecular beam deposition, metalorgano chemical vapor deposition (MOCVD), atomic layer deposition (ALD), physical vapor deposition (PVD) and other like deposition processes. In some embodiments, ALD is highly preferred in forming the rare earth metal or rare earth metal-containing composition (i.e., oxide or nitride).

Another example of an nFET threshold voltage adjusting material that can be used in the present invention as the interfacial scaling material layer is an alkaline earth metal or alkaline earth metal composition (i.e., oxide or nitride) that includes an alkaline earth element, i.e., at least one of Be, Mg, Ca, Sr, and Ba. It is noted that the present invention contemplates a mixture of alkaline earth elements as well. In one embodiment of the present invention, the alkaline earth metal or alkaline earth metal-containing composition (i.e., oxide or nitride) includes Mg.

The alkaline earth metal or alkaline earth metal-containing composition (i.e., oxide or nitride) is formed utilizing a conventional deposition process including, for example, sputtering from a target, reactive sputtering of an alkaline earth metal under oxygen plasma conditions, electroplating, evaporation, molecular beam deposition, MOCVD, ALD, physical vapor deposition (PVD) and other like deposition processes.

In addition to nFET threshold voltage adjusting materials, the interfacial scaling material layer 20 can alternatively include a pFET threshold voltage adjusting material which can be in elemental form or in a composition including elements of O or N. Examples of pFET threshold voltage adjusting elements include Al, Ge, Ti, Ni, Co, Tl and Ta.

The pFET threshold voltage adjusting materials are formed utilizing conventional deposition processes well known to those skilled in the art including, but not limited to CVD, PECVD, ALD, PVD, sputtering and plating.

Notwithstanding the type of material used as the interfacial scaling material layer 20, the interfacial scaling material layer 20 typical has a thickness from 0.1 to 5.0 nm, with a thickness from 0.3 to 2.0 nm being even more typical.

Metallic electrode 22 is formed atop the interfacial scaling material layer 20. The metallic electrode 22 includes an elemental metal, an alloy including an elemental metal, a metal silicide, a metal nitride, a metal carbide or any combination thereof including multilayers. Examples of elemental metals that can be used as the metallic electrode 22 include metals from Group VIIB, VIIB and VIII of the Periodic Table of Elements (CAS version). Preferred metallic electrodes are TaN for pFET devices, and TiN for nFET devices. The thickness of the metallic electrode 22 may vary, with typical thicknesses being from 2 nm to 200 nm. More typically, the thickness of the metallic electrode 22 is from 5 nm to 15 nm. The metallic electrode 22 can be formed utilizing any conventional process known to those skilled in the art. In one embodiment, metallic electrode 22 can be formed by a deposition process such as, for example, sputtering, chemical vapor deposition, evaporation, atomic layer deposition, and plating. When a silicide is formed, a conventional silicidation process can be used to form the same. The silicidation process can provide a fully silicided gate or a partially silicided gat including a top silicide layer and a bottom metal layer.

A Si-containing electrode 24 is formed atop the metallic electrode 22. The Si-containing electrode 24 can comprise polysilicon or silicon germanium. The Si-containing electrode 24 can be doped utilizing an in-situ doping deposition process. Alternatively, a Si-containing material is first formed by deposition, and thereafter dopants are introduced into the Si-containing material by ion implantation. The thickness of the Si-containing electrode 24 may vary, with typical thicknesses being from 25 nm to 150 nm. More typically, the thickness of the Si-containing electrode 24 is from 50 nm to 100 nm. The Si-containing electrode 24 can be formed utilizing any conventional process known to those skilled in the art. In one embodiment, the Si-containing electrode 24 can be formed by a deposition process such as, for example, CVD, PECD, ALD and evaporation.

In some embodiments and during formation of at least one of the metallic electrode 22 and the Si-containing electrode 24, high k material dopant elements (e.g., metallic species from the nFET or pFET threshold voltage adjusting materials) from the interfacial scaling material layer 20 can diffuse from layer 20, through the high k gate dielectric 18 into the interfacial layer forming modified interfacial layer 16. In another embodiment, the diffusion of the nFET threshold voltage adjusting element or the pFET threshold voltage adjusting element from the interfacial scaling material layer 20 occurs utilizing an annealing step that is performed after one of formation of layer 20, formation of metallic electrode 22, formation of Si-containing electrode 24, or after any combination of the aforementioned steps. When a separate anneal is performed, the annealing can be conducted at a temperature from 500° C. to 1100° C., with a temperature from 900° C. to 1080° C. being even more typical. Any type of anneal can be used including for example, rapid thermal anneal, a laser anneal, a spike anneal or a furnace anneal. The anneal could be used to activate source and drain dopants formed into the semiconductor substrate, or the anneal could be used as an annealing used in forming silicide contacts.

The term "modified interfacial layer" as used in the present disclosure denotes a reaction product that is formed between the diffused nFET threshold voltage adjusting element or the diffused pFET threshold voltage adjusting element and the original interfacial layer. One characteristic of the modified interfacial layer 16 is that it has a dielectric constant that is greater than the originally formed interfacial layer not including the high k material dopant element, e.g., the nFET or pFET threshold voltage adjusting element. Another characteristic of the modified interfacial layer 16 is that the diffused elements scavenge oxygen from the originally formed interfacial layer so as to form an oxygen deficient interfacial layer, i.e., the oxygen content in the modified interfacial layer is less than the oxygen content in the originally formed interfacial layer. A further characteristic is that the diffused element reduces the EOT thickness of the dielectric stack to a value that is less than the EOT obtained for a dielectric stack that does not include the modified interfacial layer 16. A yet further characteristic is that the EOT scaled high k dielectric/metal stack may have reduced electrical leakage as compared with a high k dielectric/metal stack that does not include the modified interfacial layer.

In one embodiment, the interfacial scaling material layer 20 remains within the structure and is partially consumed. In another embodiment, the interfacial scaling material layer 20 is completely consumed such that no interfacial scaling material layer 20 is present in the final gate stack. In such an embodiment, the metallic electrode 22 would be located on a surface of the high k gate dielectric 18. It is noted that after diffusion the metallic species of the interfacial scaling material layer 20 is present in both the high k gate dielectric 18 and the modified interfacial layer 16.

In one embodiment, the above can be implemented in a standard device process sequence in which the various material layers mentioned above are first deposited and then lithography and etching are used to provide a patterned gate stack as shown in FIG. 1. In yet another embodiment, the above can be implemented in a replacement gate process in which a dummy gate is first formed, removed and replaced with the various materials mentioned above.

In some embodiments, the various materials mentioned above can be formed without breaking vacuum between the various deposition steps. In yet another embodiment, the vacuum may be broken after any one, or all, of the deposition steps.

In addition to the embodiment mentioned above which is for planar logic applications, the above processing may be implemented for forming 3D semiconductor structures such as, for example, FinFETs, and/or trench capacitor structures.

Figure 2:
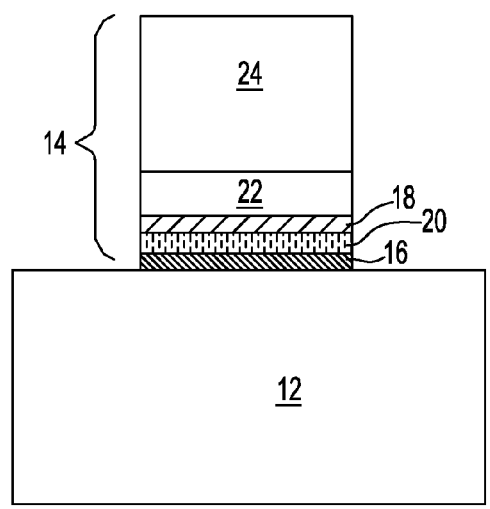
FIG. 2 is a pictorial representation (through a cross sectional view) depicting a semiconductor structure in accordance with one embodiment in which an interfacial scaling material layer is present on an upper surface of an originally formed interfacial layer.
Figure 3:
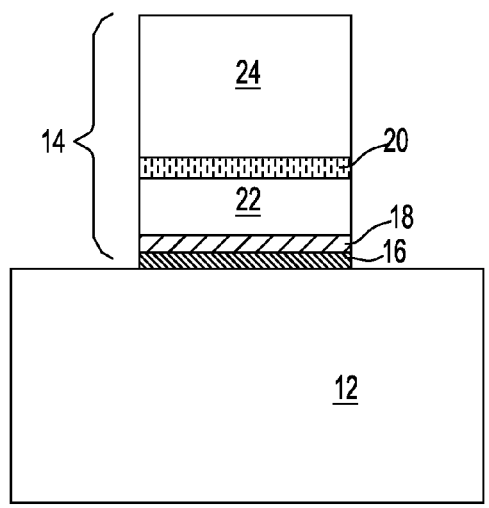
FIG. 3 is a pictorial representation (through a cross sectional view) depicting a semiconductor structure in accordance with one embodiment in which an interfacial scaling material layer is present on an upper surface of a metallic electrode.
Figure 4:
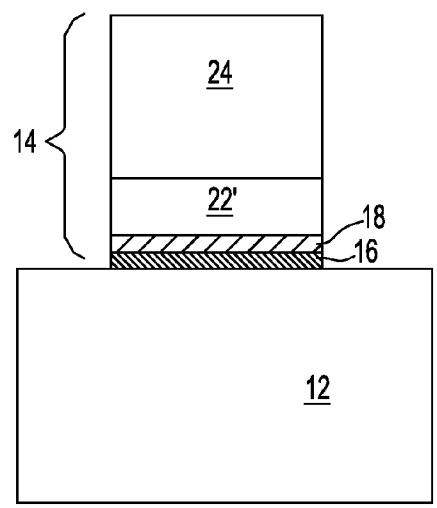
FIG. 4 is a pictorial representation (through a cross sectional view) depicting a semiconductor structure in accordance with one embodiment in which an interfacial scaling material element is present within a metallic electrode.

Modification of the above embodiment also can be carried out by altering the location of the interfacial scaling material layer 20 within the high k/metal gate stack. For example, the present invention also includes an embodiment (See FIG. 2) in which the interfacial scaling material layer 20 is formed directly on an upper surface of the original interfacial layer, instead of the high k gate dielectric 18 as shown in FIG. 1. In yet another embodiment (See FIG. 3), the interfacial scaling material layer is formed directly on an upper surface of the metallic electrode 22, instead of the high k gate dielectric 18 as shown in FIG. 1. In still another embodiment (See FIG. 4) of the present invention, the interfacial scaling material layer 20 is eliminated and the metallic electrode 22 includes one of the above mentioned nFET or pFET threshold voltage adjusting elements. In FIG. 4, reference numeral 22' denotes the metallic electrode that includes one of the mentioned nFET or pFET threshold voltage adjusting elements. In these modifications, the interfacial scaling material layer may remain and is partially consumed or, it can be completely consumed as described above. It is noted that the above processing steps can be used in any of the alternative embodiments of the invention. When the metallic electrode includes the nFET or pFET threshold voltage adjusting element, the metallic electrode is formed utilizing precursors of a metallic electrode and precursors including the nFET or pFET threshold voltage adjusting element. It is also noted that the location of the interfacial scaling material layer may vary in different device regions and that in some embodiments the interfacial scaling material layer can be located more than once in a single device region.

Figure 5:
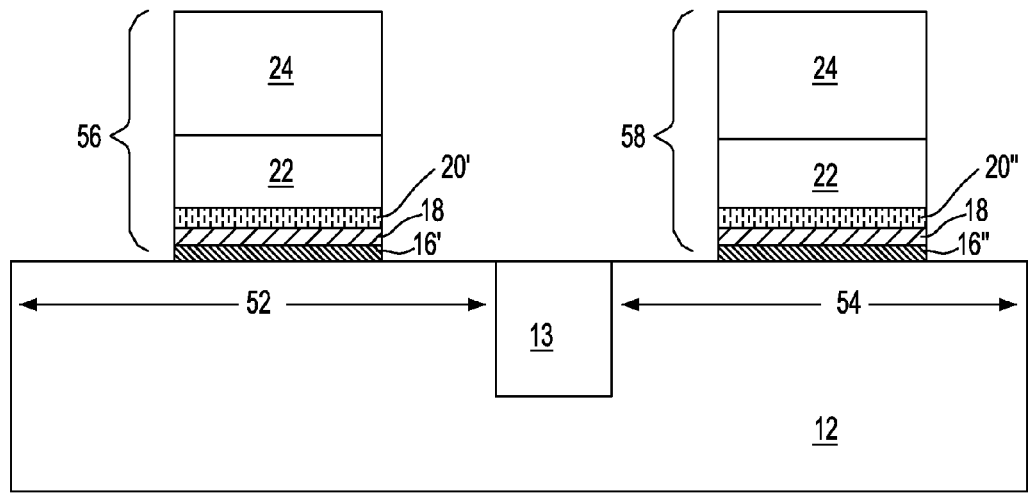
FIG. 5 is a pictorial representation (through a cross sectional view) depicting a semiconductor structure in accordance with one embodiment in which different interfacial scaling material layers are present on an upper surface of a high k gate dielectric in an nFET device region and a pFET device region, respectively.

Reference is now made to FIG. 5 which illustrates another embodiment of the invention. In this embodiment, a CMOS structure is formed that includes an EOT scaled pFET high k/metal gate stack and an EOT scaled nFET high k/metal gate stack. In particular, FIG. 5 illustrates a CMOS structure 50 including a semiconductor substrate 12 that includes an nFET device region 52 and a pFET device region 54 that are isolated from each other by isolation region 13. As is illustrated in FIG. 5, at least one EOT scaled nFET high k/metal stack 56 is located within the nFET device region 52 and at least one EOT scaled pFET high gate/metal gate stack 58 is located within the pFET device region 54. The at least one EDT scaled nFET high k/metal stack 56 includes, from bottom to top, an nFET modified interfacial layer 16', a high k gate dielectric 18, an optional nFET interfacial scaling material layer 20', a metallic electrode 22 and a Si-containing electrode 24. The at least one EOT scaled pFET high k/metal gate stack includes, from bottom to top, a pFET modified interfacial layer 16", a high k gate dielectric 18, an optional pFET interfacial scaling material layer 20", a metallic electrode 22 and a Si-containing electrode 24.

The structure 50 shown in FIG. 5 is formed by first providing semiconductor substrate 12 which is processed to include isolation region 13 which separates the nFET device region 52 from the pFET device region 54. The types of materials for the semiconductor substrate 12 and the isolation region 13 as well as processing techniques that can be used in forming the isolation region 13 are the same as that described above for the embodiment illustrated within FIG. 1. After processing the semiconductor substrate 12, an interfacial layer is formed on the exposed semiconductor substrate surface utilizing one of the processes mentioned above within the first embodiment of the present invention. A high k gate dielectric 18 is formed atop the interfacial layer utilizing one of the dielectric materials and processes mentioned above for the gate dielectric material within the first embodiment.

A first interfacial scaling material layer (either an nFET interfacial scaling material layer 20' or a pFET interfacial scaling material layer 20") is formed on the high k gate dielectric. In one embodiment and as illustrated, the first interfacial scaling material layer is an nFET interfacial scaling material. In another embodiment (not shown), the first interfacial scaling material layer is a pFET interfacial scaling material layer 20". The nFET interfacial scaling material layer 20' includes one of the nFET threshold voltage adjusting elements described in the first embodiment of the invention, while the pFET interfacial scaling material layer 20" includes one of the pFET threshold voltage adjusting elements described in the first embodiment of the invention. The first interfacial scaling material layer is formed utilizing one of the techniques described above for formation of the nFET threshold voltage adjusting materials and the pFET threshold voltage adjusting materials.

After formation of the first interfacial scaling material layer atop the high k gate dielectric 18 in both device regions, a portion of the first interfacial scaling material layer is removed from one of the device regions that would not benefit from the presence of the same, while leaving another portion of the first interfacial scaling material present in the other device region. For example, if the first interfacial scaling material includes an nFET threshold voltage adjusting material, the first interfacial scaling material layer would be removed from the pFET device region.

This 'patterning' step is achieved by forming a block mask over one of the device regions and then selectively removing via etching the first interfacial scaling material layer from one of the device regions. The selective removal of the first interfacial scaling material layer from unwanted device regions includes a wet chemical etching process which removes exposed portions of the first interfacial scaling material layer selective to the underlying layers including, for example, the high k gate dielectric 18. An example of a wet chemical etchant that can be used to selectively remove the first interfacial scaling material layer from one of the device regions includes HCl, ammonium hydroxide, HF and a mixture of ammonium hydroxide, hydrogen peroxide and water. After the selective removal step, the block mask is removed from the structure utilizing a conventional stripping process well known to those skilled in the art.

A second interfacial scaling material layer (the other of the pFET interfacial scaling material layer 20″ or the nFET interfacial scaling material layer 20′ not used as the first interfacial scaling material layer) is formed utilizing one of the deposition processes mentioned above in the first embodiment for forming interfacial scaling material layer 20. In the illustrated embodiment, the second interfacial scaling material layer is a pFET interfacial scaling material layer 20″.

After formation of the second interfacial scaling material layer within both device regions, a portion of the second interfacial scaling material layer that is located atop the first interfacial layer can be removed from one of the device regions that would not benefit from the presence of the same, while leaving another portion of the second interfacial scaling material layer present in the other device region. For example, if the first interfacial scaling material is an nFET threshold voltage adjusting material, the second interfacial scaling material layer would be a pFET threshold voltage material and the pFET threshold voltage material would be removed from the nFET device region.

This 'patterning' step is achieved by forming a block mask over one of the device regions and then selectively removing via etching the second interfacial scaling material layer from one of the device regions. The selective removal of the second interfacial scaling material layer from unwanted device regions includes a wet chemical etching process which removes exposed portions of the second interfacial scaling material selective to the underlying layers. An example of a wet chemical etchant that can be used to selectively remove the first interfacial scaling material layer from one of the device regions includes HCl, ammonium hydroxide, HF and a mixture of ammonium hydroxide, hydrogen peroxide and water. After the selective removal step, the block mask is removed from the structure utilizing a conventional stripping process well known to those skilled in the art.

After selectively removing the second interfacial scaling material layer from one of the device regions, a metallic electrode 22 and a Si-containing electrode 24 are formed. The metallic electrode 22 and the Si-containing electrode 24 include materials described above in the first embodiment, and they are formed utilizing the processing also described above.

As described in the first embodiment, elements (i.e., metallic species) from the first and second interfacial material layers can diffuse from the interfacial scaling material layers, through the high k gate dielectric 18 into the interfacial layer forming modified interfacial layers. In another embodiment, the diffusion of the nFET threshold voltage adjusting element and the pFET threshold voltage adjusting element from the interfacial scaling material layers occurs utilizing an annealing step that is performed after one of formation of the first and second interfacial scaling material layers, formation of metallic electrode 22, formation of Si-containing electrode 24, or after any combination of the aforementioned steps. When a separate anneal is performed, the annealing can be conducted within the temperature ranges mentioned above. Any type of anneal can be used including for example, rapid thermal anneal, a laser anneal, a spike anneal or a furnace anneal.

In one embodiment, one of, or both, the first and second interfacial scaling material layers remain within the structure and one of, or both, the remaining first and second interfacial scaling material layers is partially consumed. In an even further embodiment, one of, or both, the first and second interfacial scaling material layers is completely consumed such that no interfacial scaling material layers is present in the final gate stack. In such an embodiment, the metallic electrode 22 would be located on a surface of the high k gate dielectric 18.

In one embodiment, the above can be implemented in a standard device process sequence in which the various material layers mentioned above are first deposited and then lithography and etching are used to provide a patterned gate stack as shown in FIG. 5. In yet another embodiment, the above can be implemented in a replacement gate process in which a dummy gate is first formed, removed and replaced with the various materials mentioned above.

In some embodiments, the various materials mentioned above can be formed without breaking vacuum between the various deposition steps. In yet another embodiment, the vacuum may be broken after any one, or all, of the deposition steps.

In addition to the embodiment mentioned above which is for planar logic applications, the above processing may be implemented for forming 3D semiconductor structures such as, for example, FinFETs, and/or trench capacitor structures.

Figure 6:
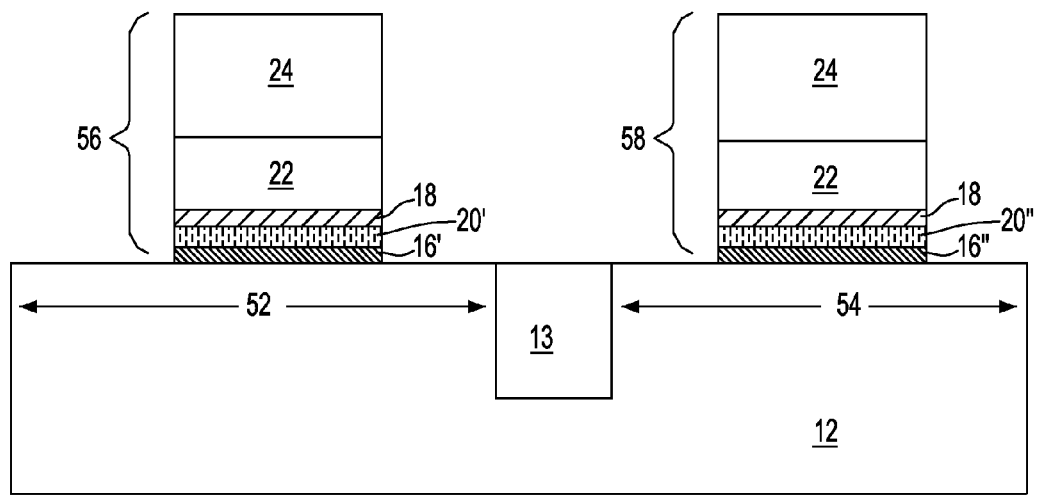
FIG. 6 is a pictorial representation (through a cross sectional view) depicting a semiconductor structure in accordance with one embodiment in which different interfacial scaling material layers are present on an upper surface of an interfacial layer in an nFET device region and a pFET device region, respectively.
Figure 7:
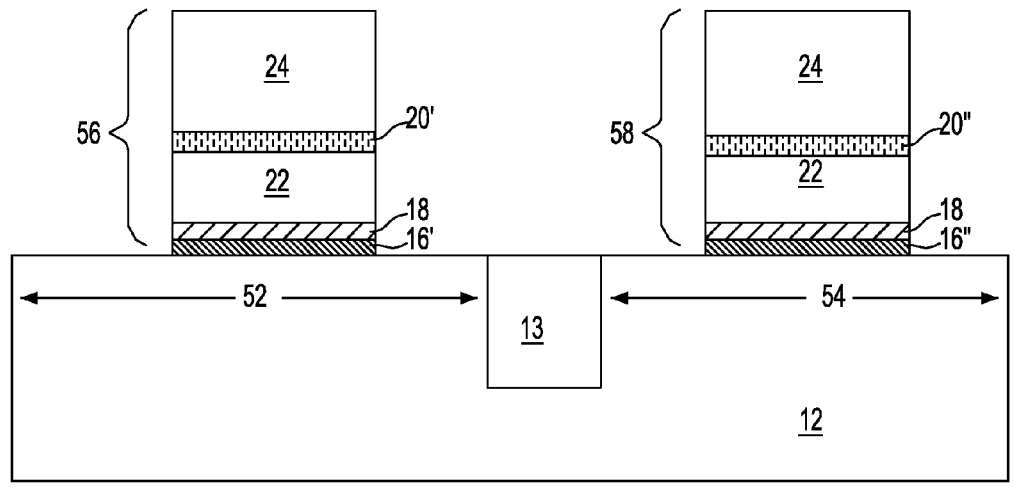
FIG. 7 is a pictorial representation (through a cross sectional view) depicting a semiconductor structure in accordance with one embodiment in which different interfacial scaling material layers are present on an upper surface of a metallic electrode in an nFET device region and a pFET device region, respectively.
Figure 8:
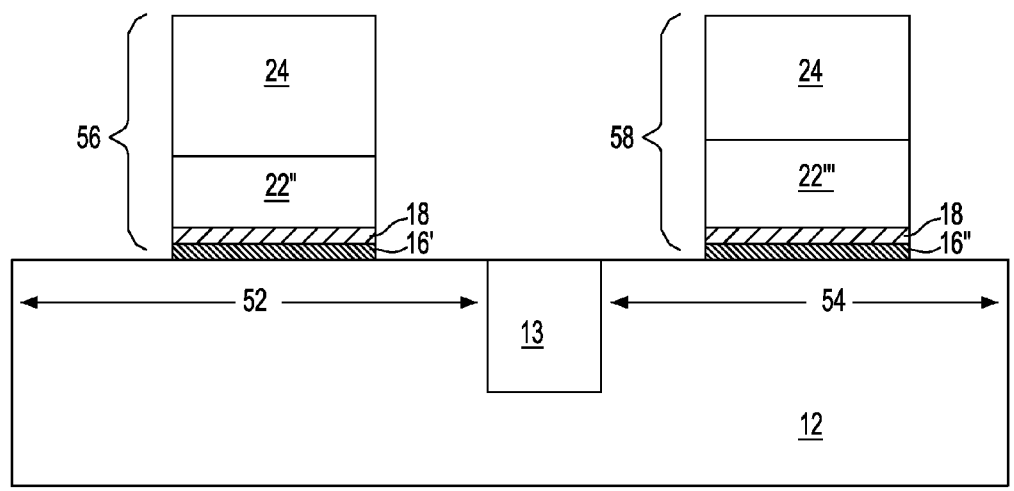
FIG. 8 is a pictorial representation (through a cross sectional view) depicting a semiconductor structure in accordance with one embodiment in which the metallic electrode in the nFET device region includes an nFET threshold voltage adjusting element and the metallic electrode in the pFET device region includes a pFET threshold voltage adjusting element.

Modification of the above embodiment can be carried out be altering the location of the interfacial scaling material layers within the high k/metal gate stack. For example, the present invention also includes an embodiment (See FIG. 6) in which an appropriate interfacial scaling material layer is formed directly on an upper surface of the original interfacial layer in both device regions, instead of the high k gate dielectric 18 as shown in FIG. 5. In yet another embodiment (See FIG. 7), an appropriate interfacial scaling material layer is formed directly on an upper surface of the metallic electrode 22 in both device regions, instead of the high k gate dielectric 18 as shown in FIG. 5. In still another embodiment (See FIG. 8) of the present invention, the interfacial scaling material layers are eliminated and the metallic electrode in both device regions includes one of the above mentioned nFET or pFET threshold voltage adjusting elements. In FIG. 8, reference numeral 22″ denotes the metallic electrode that includes the mentioned nFET threshold voltage adjusting elements, and reference numeral 22‴ denotes the metallic electrode that includes the pFET threshold adjusting elements. In these modifications, the interfacial scaling material layers may remain and be partially consumed, or they can be completely consumed as described above. It is noted that is possible to provide a CMOS structure in which only one of the device regions is scaled, while the other is not scaled. It is also noted that the location of the interfacial scaling material layer may vary in different device regions and that in some embodiments the interfacial scaling material layer can be located more than once in a single device region.

In addition to the above modifications, the present invention also includes an embodiment (see FIG. 9) in which the first interfacial scaling material layer is selectively formed directly on the surface of the original interfacial layer in one device region, while the second interfacial scaling layer is selectively formed on a surface of the high k gate dielectric 18 in the other device region. In the illustrated embodiment, the first interfacial scaling material layer is an nFET interfacial scaling material layer 20′, while the second interfacial scaling material is a pFET interfacial scaling material layer 20″. This order may be reversed depending on the underlying device region.

Figure 9:
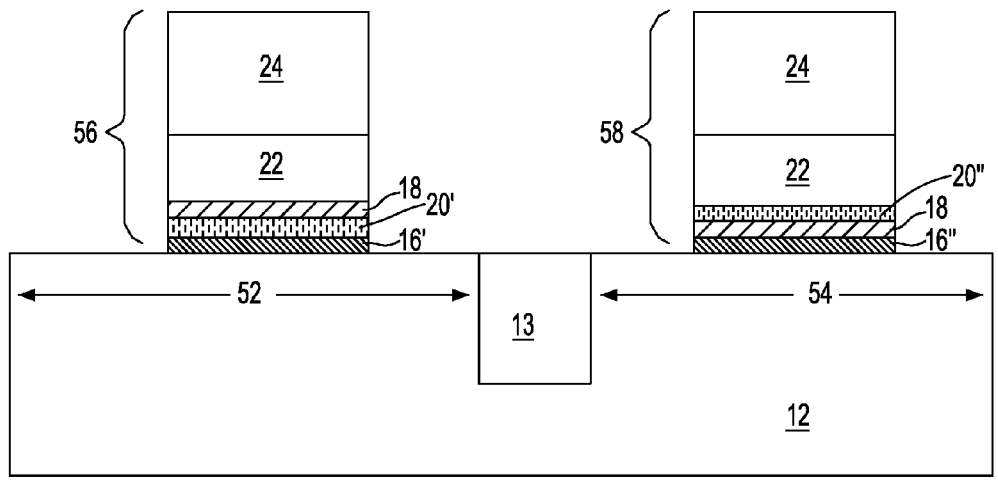
FIG. 9 is a pictorial representation (through a cross sectional view) depicting a semiconductor structure in accordance with one embodiment in which a first interfacial scaling material layer including an nFET threshold voltage adjusting element is present on an upper surface of an interfacial layer in an nFET device region and a second interfacial scaling material layer including a pFET threshold voltage adjusting element is present on an upper surface of a high k gate dielectric in a pFET device region.
Figure 10:
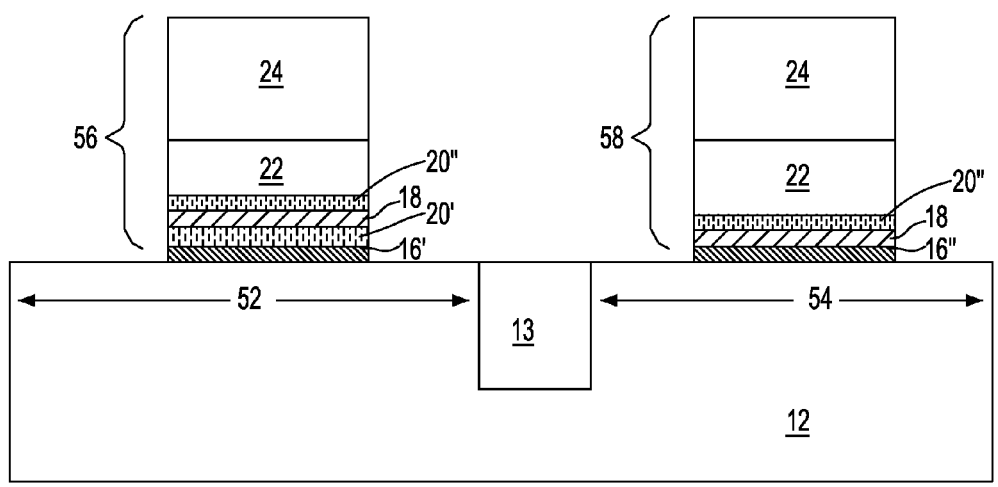
FIG. 10 is a pictorial representation (through a cross sectional view) depicting a semiconductor structure in accordance with one embodiment in which a first interfacial scaling material layer including an nFET threshold voltage adjusting element is present on an upper surface of an interfacial layer in an nFET device region and a second interfacial scaling material layer including a pFET threshold voltage adjusting element is present on an upper surface of a high k gate dielectric in both a pFET device region and the nFET device region.

FIG. 10 shows a modification to the embodiment illustrated in FIG. 9. Specifically, in FIG. 10, the second interfacial scaling material layer remains atop the high k gate dielectric 18 in both the device regions. In the illustrated embodiment, the first interfacial scaling material layer is an nFET interfacial scaling material layer 20', while the second interfacial scaling material layer is a pFET interfacial scaling material layer 20". This order may also be reversed depending on the underlying device region.

EXAMPLE

MOSFETs were formed using a gate-first process flow, e.g., basically using the process flow described in the forming the structure shown in FIG. 1. After formation of an interfacial oxide on the surface of a silicon substrate, a $HfO_2$ gate dielectric having a thickness of less than 3.0 nm was formed followed by the deposition of an interfacial scaling material layer. TiN films were deposited as metallic electrodes for devices, followed by deposition of a polysilicon electrode. All samples were annealed at 1077° C. for 5 seconds using a rapid thermal anneal process for dopant activation. In a comparative example, no interfacial scaling material layer is present between the TiN and $HfO_2$ layers.

Figure 11:
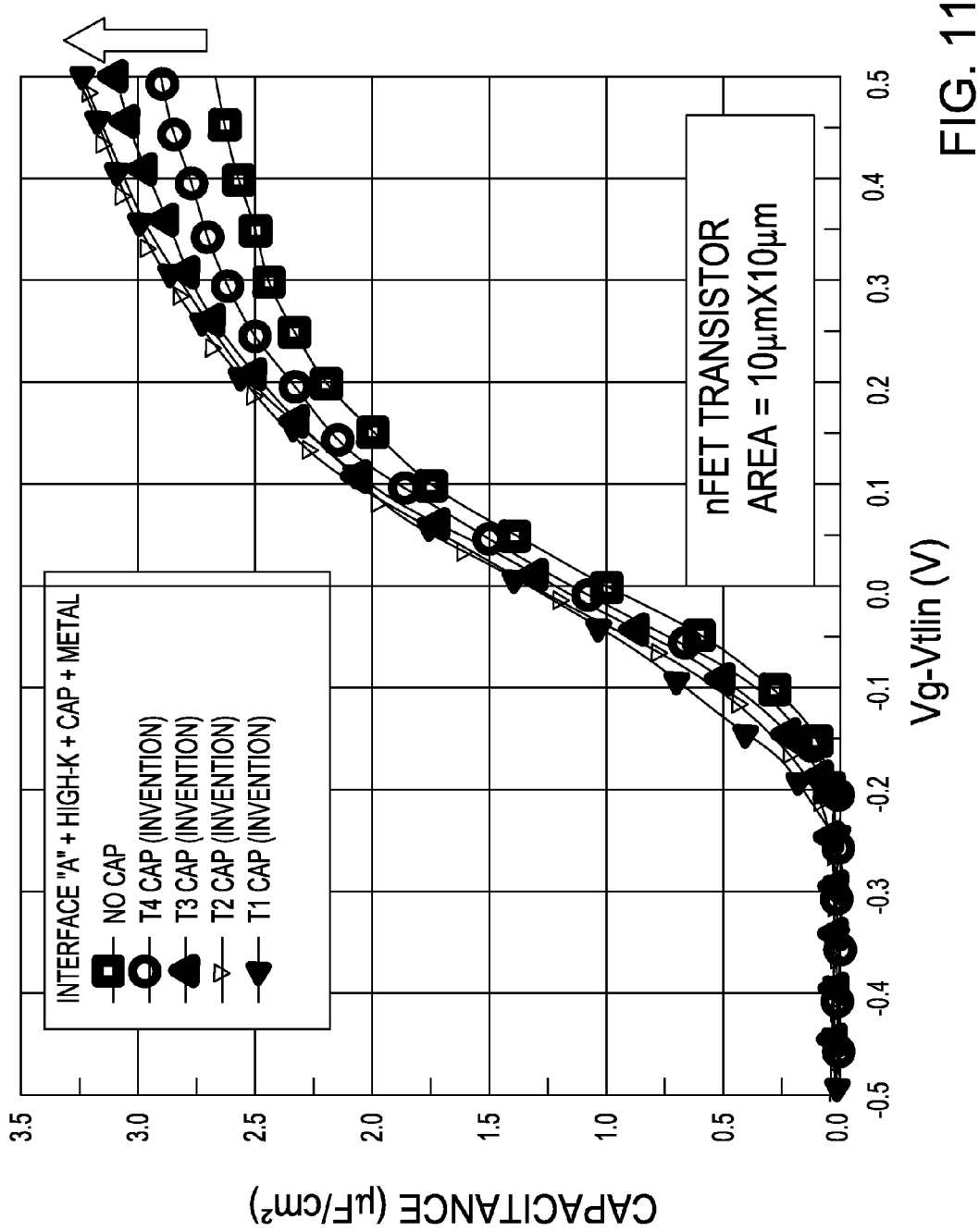
FIG. 11 shows the capacitance-voltage (C-V) curves on n-type Si including gate stacks in accordance with the invention (Invention) and a controlled gate stack containing no interfacial scaling material layer between a TiN/HfO$_2$ gate stack (labeled as no cap).
Figure 12:
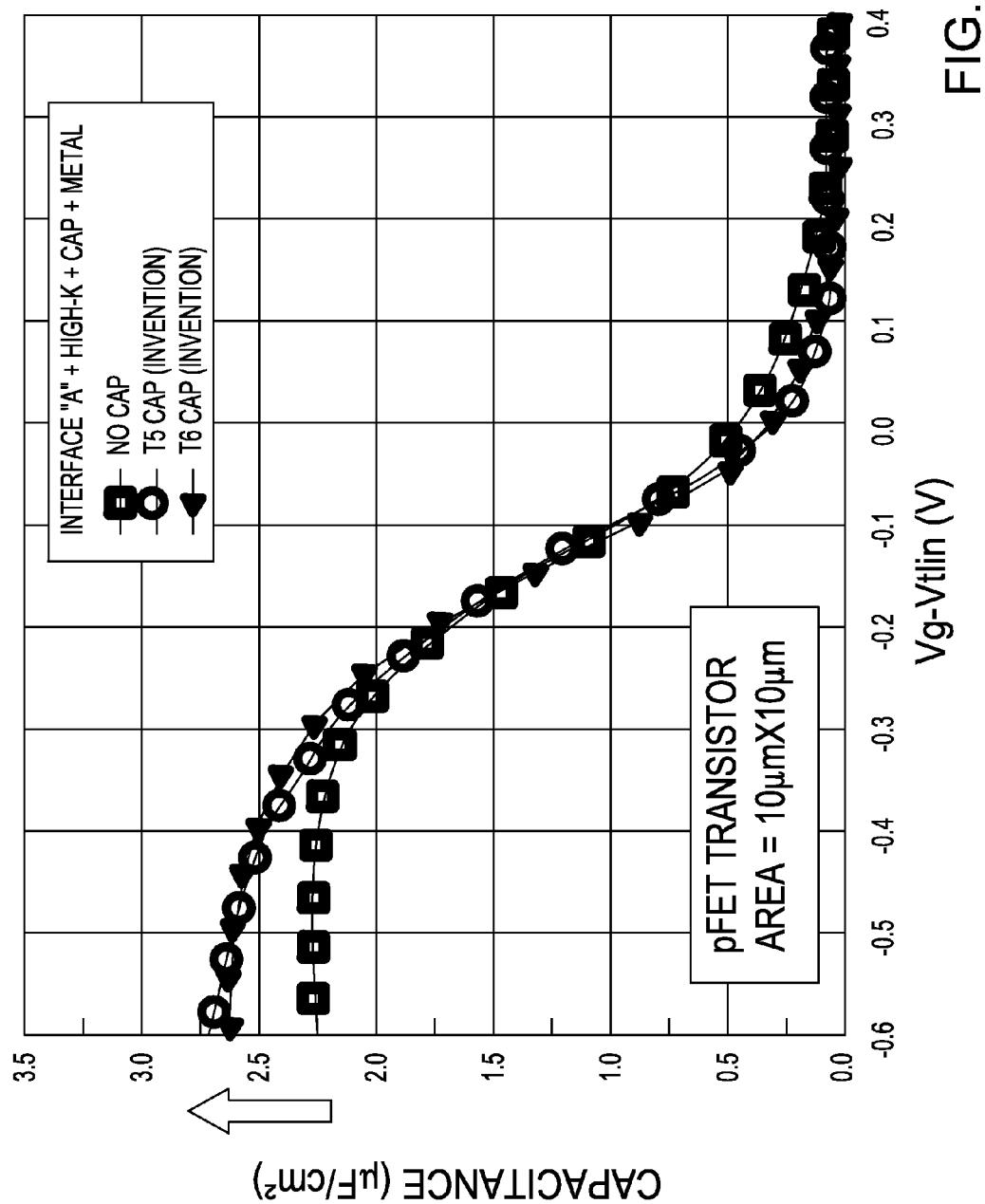
FIG. 12 shows the capacitance-voltage (C-V) curves on p-type Si including gate stacks in accordance with the invention (Invention) and a controlled gate stack containing no interfacial scaling material layer between a TiN/HfO$_2$ gate stack (labeled as no cap).

The C-V curves shown for the nFET and pFET devices in FIG. 11 and FIG. 12, respectively suggest that the optimized interfacial scaling material layer inserted between the TiN/$HfO_2$ stack enables a dramatic equivalent oxide thickness (EOT) reduction scaling. The nFET devices result in EOT down to 0.55 nm. The $V_T$ shift is not visible in the figures since the capacitance is plotted with respect to gate overdrive. ($V_G$-$V_T$). TEM analysis of the EOT scaled gate stack indicated that the interfacial layer was not clearly distinguishable and the $HfO_2$ layer was amorphous. Without wishing to be bound by any theory, applicants believe that the EOT scaling was attributed to the interfacial scaling material layer which intermixes with the dielectric stack and results in a modified interfacial layer that has a higher k than the originally formed interfacial layer. Studies also indicated that a low level of leakage of about 0.6 $A/cm^2$ was achieved with the EOT scaled high k/metal stacks for nFETs, and the leakage level is reduced by more than $10^6$ times with respect to a poly-Si/SiON model at 0.95 am $T_{inv}$ (0.55 nm EOT).

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
a semiconductor substrate having at least one device region located therein;
at least one patterned gate stack located on an upper surface of the semiconductor substrate in said at least one device region, said at least one patterned gate stack comprising, from bottom to top, a modified interfacial layer having a bottommost surface in direct contact with an uppermost surface of said semiconductor substrate, a high k gate dielectric, a metallic electrode and a Si-containing electrode, said modified interfacial layer comprising a reaction product of a semiconductor material and at least one high k material dopant element, wherein said semiconductor material is selected from a semiconductor oxide, a semiconductor nitride and a nitrided semiconductor, and said at least one high k material dopant element is selected from the group consisting of an nFET threshold voltage adjusting element and a pFET threshold voltage adjusting element.

2. The semiconductor structure of claim 1 wherein said at least one high k material dopant element is an nFET threshold voltage element, and said nFET threshold voltage element includes a rare earth metal or an alkaline earth metal.

3. The semiconductor structure of claim 1 wherein said at least one high k material dopant element is a pFET threshold voltage element, and said pFET threshold voltage element includes Al, Ge, Ti, Ni, Co, Tl or Ta.

4. The semiconductor structure of claim 1 further comprising an interfacial scaling material layer located on an upper surface of the modified interfacial layer.

5. The semiconductor structure of claim 1 further comprising an interfacial scaling material layer located on an upper surface of the high k gate dielectric.

6. The semiconductor structure of claim 1 further comprising an interfacial scaling material layer located on an upper surface of the metallic electrode.

7. The semiconductor structure of claim 1 wherein said metallic electrode includes an nFET threshold voltage adjusting element or a pFET threshold voltage adjusting element embedded therein.

8. The semiconductor structure of claim 1 wherein the modified interfacial layer has a dielectric constant that is greater than an unmodified interfacial layer not including said at least one high k material dopant element.

9. The semiconductor structure of claim 1 wherein said modified interfacial layer has less oxygen as compared to an unmodified interfacial layer not including said at least one high k material dopant element.

10. The semiconductor structure of claim 1 wherein said metallic electrode has a bottommost surface that is in direct contact with an uppermost surface of said high k gate dielectric, and said high k gate dielectric having a bottommost surface that is in direct contact with an uppermost surface of the modified interfacial layer.

11. A semiconductor structure comprising:
a semiconductor substrate having at least an nFET device region and a pFET device region that are separated by an isolation region located within the semiconductor substrate;
at least one patterned nFET gate stack located on an upper surface of the semiconductor substrate in said nFET device region, said at least one patterned nFET gate stack comprising, from bottom to top, an nFET modified interfacial layer having a bottommost surface in direct contact with an uppermost surface of said semiconductor substrate, a high k gate dielectric, a metallic electrode and a Si-containing electrode, said nFET modified interfacial layer comprising a reaction product of a semiconductor material and at least one nFET threshold voltage adjusting element, wherein said semiconductor material comprises a semiconductor oxide, a semiconductor nitride or a nitrided semiconductor oxide; and
at least one patterned pFET gate stack located on an upper surface of the semiconductor substrate in said pFET device region, said at least one patterned pFET gate stack comprising, from bottom to top, a pFET modified interfacial layer having a bottommost surface that is in direct contact with the uppermost surface of said semiconductor substrate, a high k gate dielectric, a metallic electrode and a Si-containing electrode, said pFET modified interfacial layer comprising a reaction product of a semiconductor material and at least one pFET threshold voltage adjusting element, wherein said semiconductor material comprises a semiconductor oxide, a semiconductor nitride or a nitrided semiconductor oxide.

12. The semiconductor structure of claim 11 wherein said at least one nFET threshold voltage element includes a rare earth metal or an alkaline earth metal.

13. The semiconductor structure of claim 11 wherein said at least one pFET threshold voltage element includes Al, Ge, Ti, Ni, Co, Tl or Ta.

14. The semiconductor structure of claim 11 further comprising an interfacial scaling material layer located on an upper surface of the modified interfacial layer in both device regions.

15. The semiconductor structure of claim 14 further comprising a first interfacial scaling material layer located on an upper surface of the modified interfacial layer in one of the device regions, and a second interfacial scaling material layer located atop the high k gate dielectric in at least the device region not including the first interfacial scaling material layer.

16. The semiconductor structure of claim 11 further comprising an interfacial scaling material layer located on an upper surface of the high k gate dielectric in both device regions.

17. The semiconductor structure of claim 11 further comprising an interfacial scaling material layer located on an upper surface of the metallic electrode in both device regions.

18. The semiconductor structure of claim 11 wherein said metallic electrode in the nFET device region includes an nFET threshold voltage adjusting element embedded therein and said metallic electrode in the pFET device region includes a pFET threshold voltage adjusting element embedded therein.

* * * * *